(12) United States Patent
Navone et al.

(10) Patent No.: US 9,761,780 B2
(45) Date of Patent: Sep. 12, 2017

(54) MODULABLE AND ADJUSTABLE THERMOELECTRIC DEVICE AND OPERATING METHOD OF THE THERMOELECTRIC DEVICE

(75) Inventors: Christelle Navone, Saint Jean de Moirans (FR); Tristan Caroff, Gieres (FR); Denis Cottin, Crolles (FR)

(73) Assignees: COMMISSARIAT À L'ENERGIE ATOMIQUE ET AUX ENERGIES ALTERNATIVES, Paris (FR); ST-ERICSSON SA, Plan-les-Ouates (CH)

( * ) Notice: Subject to any disclaimer, the term of this patent is extended or adjusted under 35 U.S.C. 154(b) by 760 days.

(21) Appl. No.: 13/977,282

(22) PCT Filed: Dec. 23, 2011

(86) PCT No.: PCT/FR2011/000676
§ 371 (c)(1),
(2), (4) Date: Jun. 28, 2013

(87) PCT Pub. No.: WO2012/089932
PCT Pub. Date: Jul. 5, 2012

(65) Prior Publication Data
US 2013/0291920 A1 Nov. 7, 2013

(30) Foreign Application Priority Data
Dec. 28, 2010 (FR) ...................................... 10 05146

(51) Int. Cl.
*H01L 35/32* (2006.01)
(52) U.S. Cl.
CPC .................... *H01L 35/32* (2013.01)

(58) Field of Classification Search
USPC .................................... 307/38; 136/203, 205
See application file for complete search history.

(56) References Cited

U.S. PATENT DOCUMENTS

| | | | | |
|---|---|---|---|---|
| 5,576,512 A * | 11/1996 | Doke | .................. | H02H 11/007 136/203 |
| 5,705,770 A * | 1/1998 | Ogasawara | ............... | H02J 7/34 136/205 |
| 2009/0126771 A1* | 5/2009 | Takahashi | ............... | H01L 35/32 136/203 |

OTHER PUBLICATIONS

International Preliminary Report on Patentability issued in International Patent Application No. PCT/FR2011/000676 dated Jul. 2, 2013.

* cited by examiner

*Primary Examiner* — Rexford Barnie
*Assistant Examiner* — Xuan Ly
(74) *Attorney, Agent, or Firm* — Oliff PLC (57) ABSTRACT

The thermoelectric device includes a first set of identical unitary thereto-electric systems, each system including at least one thermocouple and the first set has at least one faulty unitary thermoelectric system. It further has devices for detecting functional unitary thermoelectric systems of the first set of unitary thermoelectric systems, and devices designed to electrically connect a second set of functional unitary thermoelectric systems chosen from the first set of unitary thermoelectric systems, in the form of an electric circuit, so that all the unitary thermoelectric systems of the electric circuit have the same current flowing through them.

20 Claims, 3 Drawing Sheets

MODULABLE AND ADJUSTABLE THERMOELECTRIC DEVICE AND OPERATING METHOD OF THE THERMOELECTRIC DEVICE

BACKGROUND OF THE INVENTION

The invention relates to a thermoelectric device comprising a first set of identical unitary thermoelectric systems, each unitary thermoelectric system comprising at least one thermocouple.

STATE OF THE ART

In the field of renewable energies, a thermoelectric device enables a temperature difference between two surfaces of the device to be taken advantage of to generate an electric current, in which case a current generator device, or a Seebeck effect device, is referred to. These thermo-electric devices also enable a temperature difference to be generated in the presence of an electric current imposed in the thermoelectric device, then called Peltier effect device.

Figure 1:
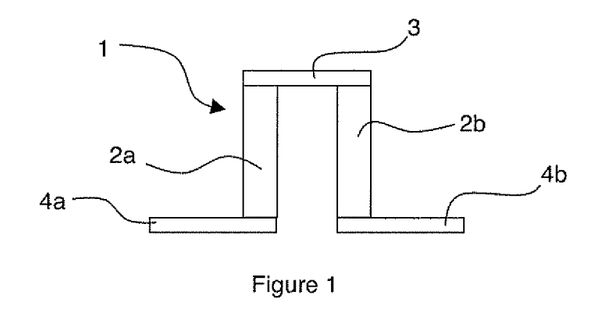
FIG. 1 illustrates a thermocouple.
Figure 2:
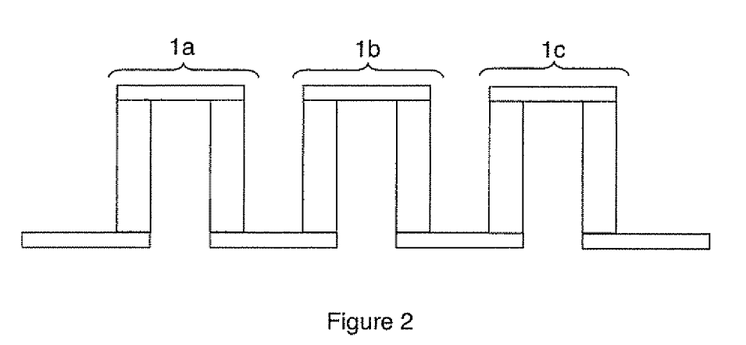
FIG. 2 illustrates three thermocouples connected in series.

A thermoelectric device in general comprises a plurality of thermocouples. In fact, as illustrated in FIG. 1, a thermocouple 1, also called thermoelectric junction, is a unitary element comprising two studs (or thermoelements) 2a, 2b made from thermoelectric materials, thermally in parallel with one another, and connected to one another at one of their coplanar ends, for example by a connection element 3, forming a hot or cold junction. The other end of the two studs is preferably respectively connected to two connection elements 4a, 4b enabling the thermocouple to be electrically connected for example to two other thermocouples as illustrated in FIG. 2 to form a series of three thermocouples 1a, 1b, 1c electrically connected in series and thermally connected in parallel. The two connection elements 4a, 4b (FIG. 1) form a complementary junction in opposition to connection element 3, i.e. cold or hot. The two studs 2a, 2b can be formed from different materials, or from electrically doped materials, preferably one of the studs being P-doped and the other stud being N-doped.

With a view to fostering development of renewable energies, thermocouples can be electrically connected in large number so as to make use of heat losses from radiators, factories, etc., and to thereby generate a current.

To date there do not exist any thermoelectric devices capable of adapting to hazards encountered in operation. What is meant by hazards encountered in operation are for example sharp temperature variations, deterioration of one or more thermocouples, etc.

The document U.S. Pat. No. 5,705,770 describes a device equipped with two thermo-electric elements able to be connected either in series or in parallel. These elements are always an integral part of the circuit.

OBJECT OF THE INVENTION

The object of the invention is to provide a device not presenting the shortcomings of the prior art.

This object tends to be met by the appended claims and particularly in that the first set comprises functional unitary thermoelectric systems and at least one faulty thermoelectric system and in that the device comprises:

means for detecting functional unitary thermoelectric systems of the first set of unitary thermoelectric systems, means designed to electrically connect a second set of functional unitary thermoelectric systems chosen from said first set of unitary thermoelectric systems, in the form of an electric circuit, so that all the unitary thermo-electric systems of the electric circuit have the same current flowing through them.

The invention also relates to a method for operation of a thermoelectric device comprising a first set of unitary thermoelectric systems, the first set comprises at least one faulty unitary thermoelectric system and functional unitary thermoelectric systems, and the method comprises the following steps:

detecting the functional unitary thermoelectric systems in the first set of unitary thermoelectric systems, electrically connecting a second set of functional unitary thermoelectric systems, chosen from the first set of unitary thermoelectric systems, to form an electric circuit so that an identical current flows through all the unitary thermoelectric systems of said electric circuit.

BRIEF DESCRIPTION OF THE DRAWINGS

Other advantages and features will become more clearly apparent from the following description of particular embodiments of the invention given for non-restrictive example purposes only and represented in the appended drawings, in which.

DESCRIPTION OF PREFERRED EMBODIMENTS

The device described in the following differs from those of the prior art in that it is able to adjust, for example when a malfunction of a unitary thermoelectric system occurs, or with a view to adjusting the connectors of the circuit in order to take advantage of an optimal circuit (for example optimizing the internal resistance and the electromotive force) according to the variations of a heat flux at the level of the device. For this, it comprises means designed to connect a sub-set of functional unitary thermoelectric systems of a first set of identical unitary thermoelectric systems. This presents the advantage of not requiring human intervention to repair a device one of the unitary thermoelectric systems of which is out of operation, and the device is then autonomous. Indeed, according to the use of the device, the latter is not necessarily accessible by a person to give him the possibility of identifying the failure and of then usually replacing the faulty unitary thermoelectric system or systems.

Figure 3:
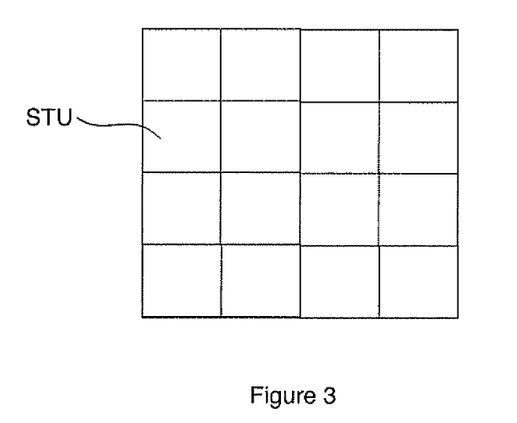
FIG. 3 illustrates a matrix of sixteen identical unitary thermoelectric systems.
Figure 4:
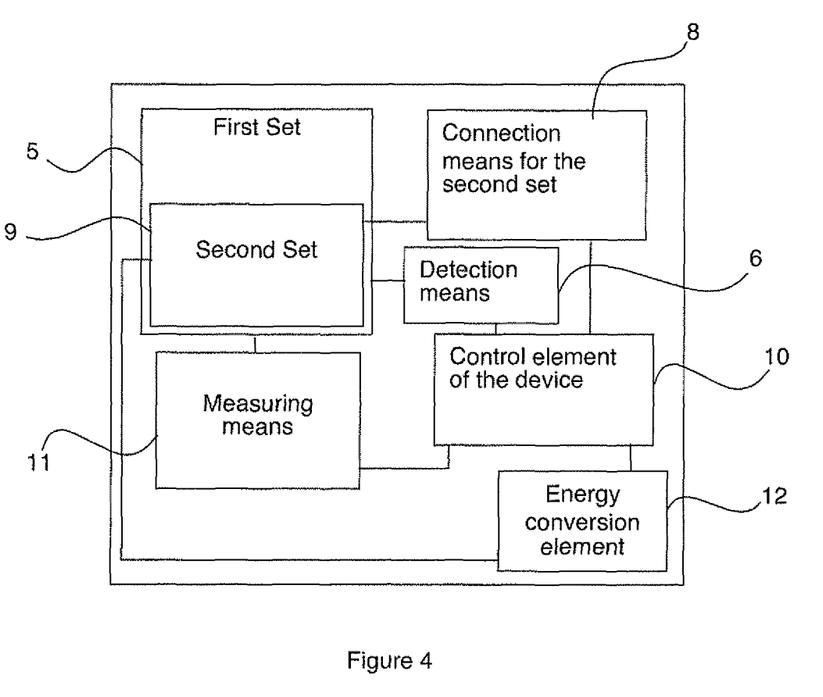
FIG. 4 schematically illustrates an embodiment of a thermoelectric device.

The thermoelectric device illustrated in FIGS. 3 and 4 comprises a first set 5 of identical unitary thermoelectric systems, for example arranged in the form of a matrix (FIG.

3). Each unitary thermoelectric system of the first set comprises at least one thermocouple.

What is meant by identical is that a unitary thermoelectric system of the first set comprises the same characteristics and electric diagram as the other unitary thermoelectric systems of the first set. A unitary thermoelectric system can in fact comprise a single thermocouple (FIG. 1) or a plurality of thermocouples (FIG. 2) associated in series or in series/parallel. Preferably, an identical current flows through all the thermocouples of a unitary thermo-electric system to limit the parasite effect in the unitary thermoelectric system. The physical parasite effect corresponds to generation of an opposite effect to that which made it arise when a thermocouple is operating in one mode, therefore in Peltier mode the thermocouple can generate a Seebeck parasite effect and vice-versa.

This first set 5 can in fact comprise all of the unitary thermoelectric systems that are to be found in the device, i.e. sixteen unitary thermoelectric systems in the particular example of FIG. 3 (where a square represents a unitary thermoelectric system STU). This number of unitary thermoelectric systems of first set 5 is preferably greater than the number of necessary unitary thermoelectric systems defined in the customer specifications in order to ensure optimal operation throughout the lifetime of the device. Each unitary thermoelectric system can have the form of the thermocouple of FIG. 1 described in the prior art if the unitary thermoelectric system concerned comprises a single thermocouple.

The device further comprises means for detecting 6 functional unitary thermoelectric systems of first set 5 of unitary thermoelectric systems. These means for detecting in fact enable the functional unitary thermoelectric systems, and therefore the faulty systems, of first set 5 to be detected. A functional unitary thermoelectric system is a thermoelectric system having an electric continuity, for example a current can flow in the unitary thermoelectric system between two terminals of said system. What is meant by terminals of a unitary thermoelectric system are electric terminals of said system enabling for example the systems to be electrically connected to one another. Each system then comprises two terminals.

Figure 5:
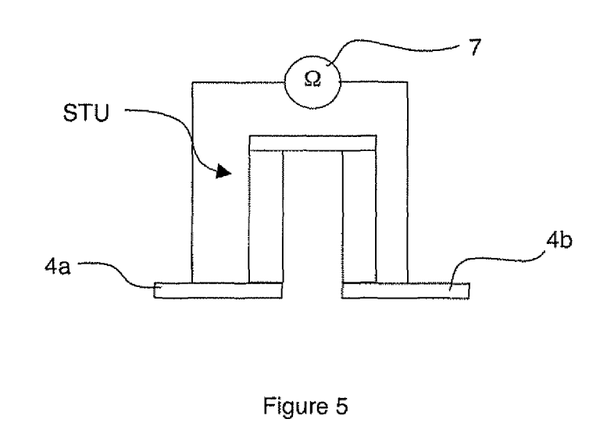
FIG. 5 illustrates means for detecting a malfunction, or operation, of a unitary thermoelectric system.

Means for detecting 6 the functional unitary thermoelectric systems can thus, as illustrated in FIG. 5, comprise a measuring element 7 of the electric continuity in a unitary thermoelectric system of first set 5 of unitary thermo-electric systems. This measuring element 7 can for example be an ohmmeter electrically connected to the two terminals of the associated unitary thermo-electric system STU (in the particular example of FIG. 5, the two terminals of the system coincide with connection elements 4a, 4b of a thermocouple). Preferably, each unitary thermoelectric system of first set 5 is associated with a distinct measuring element thereby enabling the faulty and functional unitary thermoelectric systems of first set 5 to be mapped at any time.

The device also comprises means 8 designed to electrically connect a second set 9 of functional unitary thermoelectric systems chosen from first set 5, in the form of an electric circuit, so that the same current is flowing through all the unitary thermoelectric systems of the circuit (defining a condition on the current), to among other things avoid the parasite effect described in the foregoing. As illustrated in FIG. 4, means 8 designed to electrically connect second set 9 of unitary thermoelectric systems can be controlled by a control element 10 connected to means for detecting 6 (themselves connected to first set 5) to be informed of the list of functional and faulty unitary thermoelectric systems.

Control element 10 can thus know the mapping of the functional unitary thermoelectric systems of first set 5, and can then determine second set 9. Control element 10 can then be connected to means 8 designed to connect second set 9 to control them and request connection of the unitary thermoelectric systems of second set 9 according to a particular electric diagram. The circuit can be formed using a matrix of changeover switches (not shown) associated with the unitary thermoelectric systems of first set 5 and arranged so as to enable all the possible connections between unitary thermoelectric systems of second set 9. In order to facilitate the connections, each unitary thermoelectric system of the first set can comprise an electric changeover switch connected in parallel to its terminals, the changeover switch comprising a lower series resistance than that of the associated unitary thermoelectric system, thereby enabling shunting of the unitary thermoelectric system causing deactivation of the unitary thermo-electric system concerned.

Second set 9 of unitary thermoelectric systems can, in an ideal case, comprise the same number of unitary thermoelectric systems as first set 5. This ideal case being that where no faulty unitary thermoelectric system is detected and where it is sought to use all the unitary thermoelectric systems of the device. Second set 9 can naturally also comprise less unitary thermo-electric systems than first set 5.

As set out in the above, the different electric layouts of the circuit can be affected by the presence of a parasite Peltier effect when the device is operating in current generator mode (Seebeck effect operating mode). This effect consumes a part of the generated current and locally modifies the temperature difference at the level of the unitary thermoelectric systems of second set 9, resulting in a decrease of the performances of the circuit. This is avoided if all the unitary thermoelectric systems forming the circuit have an identical current flowing through them.

This condition on the current can be achieved for example if all the unitary thermoelectric systems of the second set are connected in series, in parallel, or if second set 9 of unitary thermoelectric systems is connected in such a way that the circuit comprises a plurality of series of unitary thermoelectric systems, all the series comprising an identical number of unitary thermo-electric systems and being connected in parallel to one another.

The voltage at the terminals of the circuit formed by second set 9 of unitary thermoelectric systems is proportional to the temperature difference applied to the device, i.e. to second set 9 of unitary thermoelectric systems. The temperature difference can be seen as the temperature difference between the hot junctions and the cold junctions of the thermocouples.

Indeed, the electromotive force VTEG of the circuit can be equal to $n*S_u*\Delta T$ where n is the number of unitary thermoelectric systems in series of the circuit, $S_u$ the Seebeck coefficient of a unitary thermoelectric system, which is in this case a function of the P and N materials used in each thermocouple, and $\Delta T$ the temperature difference at the level of the generator, i.e. the temperature difference applied between the hot and cold junctions of the thermocouple or thermocouples of the unitary thermoelectric systems of second set 9.

To favour the voltage generated by the circuit when the temperature difference is small, it is preferable for the circuit to have the largest number of unitary thermoelectric systems in series. Whereas for a large temperature difference, it may be preferable to reduce the resistance of the circuit, to perform a maximum power transfer, and for this the circuit must have the largest number of unitary thermoelectric systems in parallel.

Given that the temperature difference influences the voltage, in order to be able to take this temperature difference into account, the device can comprise measuring means 11 (FIG. 4) of a potential difference at the terminals of at least one unitary thermoelectric system of second set 9, or of a portion of the circuit (potential difference measured between any two points of the circuit), or of a functional thermoelectric system of first set 5. In other words, the electric diagram of the circuit can then depend on measurement of a particular potential difference, said measurement being performed by measuring means 11 connected to corresponding terminals.

Measuring means 11 can be connected, as illustrated in FIG. 4, to one unitary thermoelectric system or to several unitary thermoelectric systems connected to one another (of the first and/or of the second set), and to control element 10 so as to communicate to the latter the value of the measured potential difference to determine the suitable electric diagram of the circuit. Control element 10 can then control means 8 designed to connect second set 9 of unitary thermoelectric systems to achieve said suitable diagram. For this, control element 10 can comprise a correspondence table associating a potential difference to a particular circuit.

In order to determine the electric diagram of the circuit, it is possible on start-up of the device to form any first circuit (where an identical current is flowing through all the unitary thermoelectric systems), to perform potential difference measurement at least at the level of one unitary thermoelectric system of second set 9, and then according to the measurement, to reform an optimized second circuit. It is also possible on start-up to determine the functional unitary thermoelectric systems of first set 5, to measure a potential difference at the terminals of one of the functional unitary thermoelectric systems of first set 5, and to then form second set 9 and the associated circuit from said measurement.

As the potential difference is able to vary in the course of time, when the device is in operation, a potential difference will be able to be measured at least at the terminals of one unitary thermoelectric system of second set 9 forming a circuit so as to modify the circuit accordingly, if necessary. For this, measurements can be made at regular intervals.

In a particular example embodiment, the device comprises an energy conversion element 12 electrically connected to the circuit to recover the current and to use it. Energy conversion element 12 can be a DC-DC converter, of charge pump type, etc. The different preferential electric diagrams of the circuit are determined in the following table drawn up in the case of a second set of $2^4$ unitary thermoelectric systems for a conversion circuit 12 presenting the same resistance $R_{TEG}$:

Table 1 in fact takes into consideration that second set 9 comprises $2^4$ unitary thermoelectric systems, and that the device is perfect, i.e. that all the unitary thermoelectric systems of first set 5 will be used to form second set 9. In other words, none of the unitary thermoelectric systems is, or will be, faulty. $VTEG_u$ corresponds to the electromotive force, i.e. the voltage, generated at the terminals of a unitary thermoelectric system operating in generator mode. $RTEG_u$ corresponds to the resistance of a unitary thermoelectric system. This table enumerates preferential configurations for a circuit of sixteen unitary thermoelectric systems satisfying the condition according to which each unitary thermoelectric system of the circuit has an identical current flowing through it.

In the particular case of table 1, the possible diagrams of the circuit in fact consist in series connection of all the unitary thermoelectric systems of the second set, or parallel connection of all the unitary thermoelectric systems, or again parallel connection of several series of unitary thermoelectric systems of second set 9, said series connected in parallel all having the same number of unitary thermoelectric systems.

In a first step, it can be observed that for an optimal power transfer, energy conversion element 12 has to present an input resistance equivalent to the input resistance of the circuit formed by second set 9. In other words, the input voltage of energy conversion element 12 is equal to the total voltage VTEG of the circuit divided by two. This in particular requires the impedance of energy conversion element 12 to be adjusted to the circuit formed by second set 5 of unitary thermoelectric systems. The energy conversion element can thus comprise means for adjusting its impedance according to the resistance of the associated circuit.

Reading of table 1 thus enables it to be ascertained that the voltage is favoured, in the case where the unitary thermoelectric systems are all connected in series, and that the current is favoured in the case where the unitary thermoelectric systems are all connected in parallel. In both cases, a constant transferable power is conserved.

The input power transferred to energy conversion element 12, when the internal resistance of conversion element 12 is equal to the resistance of the circuit to which it is connected, can be generalized in the form of a maximal power $$P_{in} = \left(\frac{2^N}{4}\right) * \frac{VTEG_u^2}{RTEG_u},$$

all the diagrams of circuits of table I present an equivalent transferred power for different input voltages being able to be generalized, for $2^N$ unitary thermoelectric systems, at an input voltage value comprised between

TABLE 1

| Configuration number | Number of series of TEGu in parallel | Number of TEGu in a series | Input voltage of the energy conversion element | Input current of the energy conversion element | Input power of the energy conversion element |
| --- | --- | --- | --- | --- | --- |
| 1 | 1 | 16 | 8 * VTEGu | VTEGu/(2 * RTEGu) | 4VTEGu²/RTEGu |
| 2 | 2 | 8 | 4 * VTEGu | VTEGu/(1 * RTEGu) | |
| 3 | 4 | 4 | 2 * VTEGu | 2 * VTEGu/RTEGu | |
| 4 | 8 | 2 | 1 * VTEGu | 4 * VTEGu/RTEGu | |
| 5 | 16 | 1 | VTEGu/2 | 8 * VTEGu/RTEGu | |

$$\left(\frac{2^N}{2}\right)*VTEG_u \text{ and } \frac{1}{2}*VTEG_u.$$

As indicated in the foregoing, the current flowing in all the unitary thermoelectric systems of the circuit is independent from the association chosen in table I and is equal to $$\frac{VTEG_u}{2*RTEG_u}.$$

This has the consequence of preventing the parasite Peltier effect, and of ensuring uniformity of the temperature in all the unitary thermoelectric systems of the second set with a view to maximizing the output power.

Figure 6:
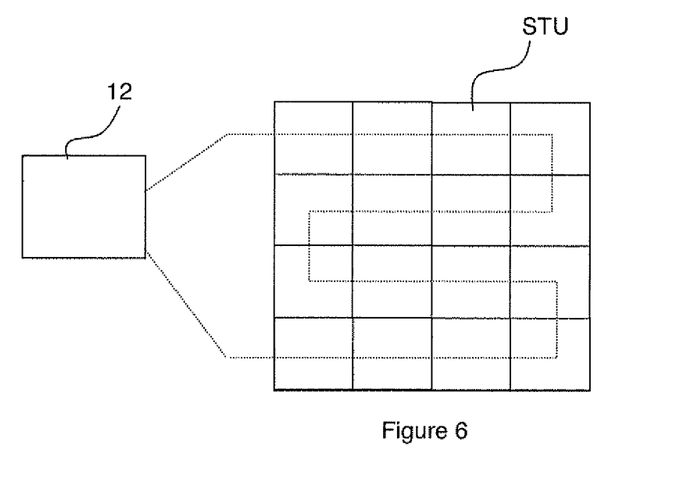
FIG. 6 illustrates the matrix of FIG. 3 in which the identical unitary thermoelectric systems are all connected in series.
Figure 7:
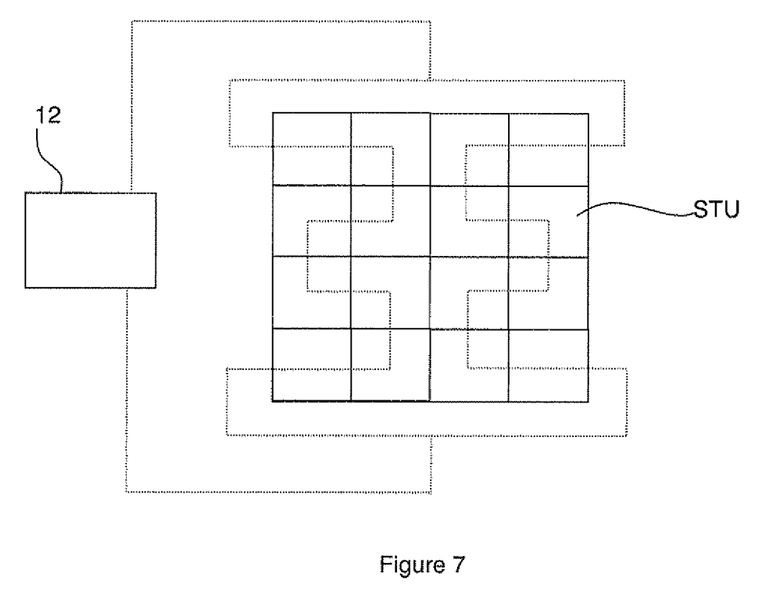
FIG. 7 illustrates the matrix of FIG. 3 in which the identical unitary thermoelectric systems are divided into two electric series of eight unitary thermoelectric systems, the series being electrically connected in parallel.

Thus, in the particular example of table 1, for a small temperature difference giving a small value of $VTEG_u$, configuration number one of table 1 will be implemented, as illustrated in FIG. 6 where the sixteen unitary thermoelectric systems STU are connected in series to be able to take advantage of an optimum voltage on input of energy conversion element 12. In FIG. 6, series connection of the unitary thermoelectric systems is illustrated schematically by the broken line. For a large temperature difference, the value $VTEG_u$ will be high, and configuration number five of table 1 will be implemented to transfer the maximum current to the energy conversion element. For intermediate differences, configurations 2, 3 and 4 will be able to be chosen. FIG. 7 illustrates the device with sixteen unitary thermoelectric systems STU according to configuration number two comprising two series of eight unitary thermoelectric systems, said series being electrically connected in parallel at the level of two corresponding current collectors, themselves connected to energy conversion element 12.

The selected diagram may also be chosen according to the step-up ratio of energy conversion element 12 (ratio of the output voltage over the input voltage) to be produced by energy conversion element 12 according to the variation of the temperature difference. In other words, in the course of operation of the device, the electric diagram of the circuit will be able to change to adjust to a new temperature difference.

As related in the foregoing, in order to ensure quality of service with time, first set 5 of unitary thermoelectric systems can comprise a larger number of unitary thermoelectric systems than the minimum number required to achieve the required power of energy conversion element 12. Noting the minimum number of unitary thermoelectric systems $2^N$, it is considered that the first set comprises $2^N$ plus $2^R$ unitary thermoelectric systems. Thus, in the course of the lifetime of the device, if certain unitary thermoelectric systems of the first set malfunction, it will always be possible to reconnect $2^N$ unitary thermo-electric systems to guarantee the capacity of the circuit, i.e. to generate the required power at the level of conversion element 12. A unitary thermo-electric system can have a more or less limited lifetime according to manufacturing defects, its lifetime in operation, etc. Furthermore, a large number of unitary thermoelectric systems also enables possible problems of manufacture of the device in which certain unitary thermoelectric systems prove to be faulty when manufacturing of the device is completed to be remedied. In the course of lifetime of the device, the number of available and functional unitary thermoelectric systems of first set 5 varies in the following manner $2^N+x*\Sigma 2^p$ with p varying from 0 to R and x equal to 1, if p is comprised between 1 and R, or 0 if p is equal to 0.

Consequently, if the device comprises an energy conversion element 12 electrically connected to the circuit, the number of unitary thermoelectric systems of second set 9 can depend on the required input power of energy conversion element 12. Having additional unitary thermoelectric systems available can thus also enable the power which is to be provided to the input of conversion element 12 to be varied.

The table below sets out electric diagrams of possible circuits for 16, 18, 20, 24 unitary thermoelectric systems in second set 9 (first set 5 comprising 24 unitary thermoelectric systems), in parallel series association, i.e. comprising one or more series, each series if required being electrically connected in parallel with the other series, and the series all comprising the same number of unitary thermoelectric systems.

TABLE 2

| number | $2^4$ | | $2^4 + 2^3$ | | $2^4 + 2^2 + 2^1$ | | $2^4 + 2^2$ | | $2^4 + 2^1$ | |
| --- | --- | --- | --- | --- | --- | --- | --- | --- | --- | --- |
| | P | S | P | S | P | S | P | S | P | S |
| 1 | 1 | 16 | 3 | 8 | 11 | 2 | 5 | 4 | 9 | 2 |
| 2 | 2 | 8 | 6 | 4 | 22 | 1 | 10 | 2 | 18 | 1 |
| 3 | 4 | 4 | 12 | 2 | — | — | 20 | 1 | — | — |
| 4 | 8 | 2 | 24 | 1 | — | — | — | — | — | — |
| 5 | 16 | 1 | — | — | — | — | — | — | — | — |

Table 2 above defines a first constraint, i.e. that the device always has to comprise a minimum of $2^4$ available unitary thermoelectric systems among the 24 of the first set of unitary thermoelectric systems (N=4 and R=3). The column associated to $2^4$ represents the different combinations complying with the condition on the current for 16 unitary thermoelectric systems forming the circuit.

P represents the number of series of unitary thermoelectric systems in parallel (1 representing a single series, 2 two series in parallel, etc.), and S represents the number of unitary thermoelectric systems per series of unitary thermoelectric systems.

Knowing that the device supplied to the customer in fact comprises 24 unitary thermoelectric systems, the column associated to $2^4+2^3$ represents the different combinations complying with the condition on the current for 24 functional unitary thermoelectric systems forming the circuit (in other words, in this case, the first set is identical to the second set).

The column associated to $2^4+2^2+2^1$ corresponds to the possible associations of the maximum of functional unitary thermoelectric systems of the first set, i.e. 22, knowing that one or two unitary thermoelectric systems are faulty. In fact, if a unitary thermoelectric system is faulty, another unitary thermo-electric system will be disconnected so as to comply with the condition relative to the current.

The column $2^4+2^2$ corresponds to the possible associations of the maximum of functional unitary thermoelectric systems of the first set, i.e. 20, knowing that three or four unitary thermoelectric systems are faulty. In fact, if three unitary thermoelectric systems are faulty, a fourth unitary thermoelectric system will be disconnected so as to comply with the condition relative to the current.

The column $2^4+2^1$ corresponds to the possible associations of the maximum of functional unitary thermoelectric systems of the first set, i.e. 18, knowing that five or six unitary thermoelectric systems are faulty. In fact, if five unitary thermoelectric systems are faulty, a sixth unitary thermoelectric system will be disconnected so as to comply with the condition relative to the current.

In the case where 24 unitary thermoelectric systems can be connected to form the circuit, the power of the circuit thus formed is $$6 * \frac{VTEG_u^2}{RTEG_u},$$

for 22 unitary thermoelectric systems the power is $$\frac{11}{2} * \frac{VTEG_u^2}{RTEG_u},$$

for 20 unitary thermoelectric systems the power is $$5 * \frac{VTEG_u^2}{RTEG_u},$$

for 18 unitary thermoelectric systems the power is $$\frac{9}{2} * \frac{VTEG_u^2}{RTEG_u},$$

and for 16 unitary thermoelectric systems the power is $$4 * \frac{VTEG_u^2}{RTEG_u}.$$

Naturally, if 24 unitary thermoelectric systems are functional, according to the required power, the diagrams of the circuits with 22, 20, 18 and 16 unitary thermoelectric systems can be achieved by the means designed to connect the second set, in other words when a number of functional unitary thermoelectric systems are available, all the circuit diagrams using a smaller number of unitary thermoelectric systems, and complying with the condition on the current, can be achieved.

The invention is naturally not limited to the number of unitary thermoelectric systems of table 2, but can be generalized to any even number of unitary thermoelectric systems enabling parallel connection of a plurality of series of unitary thermoelectric systems having an identical number of unitary thermo-electric systems, or a single series of unitary thermoelectric systems.

According to a development, the device comprises a table comprising different electric diagrams of the circuit according to a required power value and to a potential difference value. Thus, depending on the required power of conversion element 12 and on measurement of the potential difference, the electric diagram of the circuit to be achieved can be extracted from said table. This table can also depend on the number of functional unitary thermoelectric systems of the first set in order to come as close as possible to the required power of the conversion element.

This table can be drawn up in the plant to list the different circuit diagrams, and can for example be stored in control element 10. By means of this, the circuit can adjust to its environment and to its possible malfunctions.

The device also presents the advantage of being able to be reconfigured in case of detection of a malfunction during its operation, or of a modification of the required input power on account of the variation of the heat flux received by second set 9, thereby avoiding any manual intervention. If such modifications are detected by control element 10, the latter can establish a new electric diagram and control means 8 designed to electrically connect second set 9 of unitary thermoelectric systems to reconnect a new second set corresponding to the new characteristics of the device.

According to a particular example embodiment, energy conversion element 12 is designed to be connected to an apparatus comprising two states, a first state being representative of an operating mode of the apparatus at full power, and a second state being representative of a standby state of the apparatus. Control element 10 can thus be connected to energy conversion element 12 to know its operating state (FIG. 4). According to the state of energy conversion element 12, control element 10 will be able to command the means designed to connect second set 9 to connect a new circuit diagram with a new second set of unitary thermoelectric systems adjusted to the required power for the operating mode. In this example, connection means 8 can be pre-configured in the plant in order to provide a second set 9 only presenting these two operating states in order to simplify connections and manufacturing.

In order to generalize the operating method of the device as described above, the latter comprises at least a step of detection of the functional unitary thermoelectric systems in first set 5 of unitary thermoelectric systems, and a step of electric connection of second set 9 of functional unitary thermo-electric systems, chosen from first set 5, to form the electric circuit so that an identical current is flowing through all the unitary thermoelectric systems of said electric circuit. If the circuit is connected to an energy conversion element 12 comprising a required input power, the number of unitary thermo-electric systems of second set 9 can depend on said required power as stipulated in the foregoing.

According to the embodiment using measurement of the potential difference, the method can, prior to the electric connection step, comprise a step of determining the electric diagram of the circuit to be formed according to said measurement. Measurement can be made at the terminals of at least one unitary thermoelectric system of second set 9 or at the terminals of a functional thermoelectric system of first set 5.

The different steps of the method can take place on start-up of the device, and/or during operation of the latter to adjust to changes of the parameters.

The invention is not limited to a thermoelectric device operating in current generator mode, but can also apply to a thermoelectric device operating in Peltier mode, or cooling mode. Parasite Seebeck effect will then be referred to. In this operating mode, the circuit has flowing through it an input current which creates a temperature difference and therefore cooling of the circuit. The parasite Seebeck effect consumes a part of the generated temperature difference and locally modifies the current resulting in a reduction of performances. In similar manner to the current generator embodiment, the circuit will adapt according to the input current provided and to the faulty elements (unitary thermoelectric systems). Measuring means 11 used for finding the optimal configuration of second set 9 will enable measurement of the current of this set from one or more unitary thermoelectric systems.

In other words, when in the device the first set comprises functional unitary thermoelectric systems and at least one faulty unitary thermoelectric system, it is possible to determine an optimum operating circuit to advantageously achieve a predefined required operating power of the device, by means of the circuit. If several unitary thermoelectric systems malfunction, the circuit will adjust accordingly.

The fact that an identical current is flowing through all the functional thermo-electric systems of the circuit implicitly corresponds to the fact that the circuit is only composed of functional unitary thermoelectric systems. That is to say that for a given circuit, the faulty thermoelectric systems are removed from said circuit so as for example not to induce any parasite operating effect. It is consequently considered that the faulty unitary thermoelectric systems are disconnected.

As stipulated in the foregoing, providing a device equipped with a plurality of unitary thermoelectric systems the number of which enables the required power to be exceeded advantageously enables the faulty systems to be disconnected and to be replaced by functional systems so as to always ensure that the required power is provided. There is therefore a redundance which enables certain malfunctions to be automatically remedied. Consequently, so long as this is possible, the circuit always operates at its optimum providing the required power.

The device can further comprise means (for example a switch system) for disconnecting the faulty elements so as to isolate them totally from the circuit. This enables for example the end connection terminals of the unitary thermoelectric systems to be electrically isolated. In other words, in general manner, each faulty unitary thermoelectric system is therefore electrically isolated from the circuit.

The invention claimed is:

1. A thermoelectric device comprising:
    a first set of identical unitary thermoelectric systems, each unitary thermoelectric system comprising at least one thermocouple, the first set comprising functional unitary thermoelectric systems and at least one faulty thermo-electric system,
    a detector configured for detecting functional unitary thermoelectric systems of the first set of unitary thermoelectric systems,
    a control circuit configured to electrically connect a second set of functional unitary thermoelectric systems chosen from said first set of unitary thermoelectric systems, in the form of an electric circuit wherein all the unitary thermoelectric systems of the electric circuit have the same current flowing through them, and
    the thermoelectric device is configured to generate electric power by means of the identical unitary thermoelectric systems and by means of a temperature gradient available along the identical unitary thermoelectric systems.

2. The device according to claim 1, wherein the control circuit is designed to provide a predefined required power reached by the circuit, all the unitary thermoelectric systems of the circuit only being functional elements.

3. The device according to claim 1, wherein a form of the electric circuit depends on measurement of a potential difference performed by a measuring device connected to terminals of at least one unitary thermoelectric system of the second set, or to terminals of a functional unitary thermoelectric system of the first set.

4. The thermoelectric device according to claim 1, comprising an energy conversion element electrically connected to the electric circuit, a number of unitary thermoelectric systems forming the second set depending on a required input power of the energy conversion element.

5. The thermoelectric device according to claim 4, comprising a table including different electric diagrams of the electric circuit according to a required power value and a potential difference value.

6. The device according to claim 1, wherein the detectors comprise a measuring element configured for measuring an electric continuity in a unitary thermoelectric system of the first set of unitary thermoelectric systems.

7. The device according to claim 1, wherein each unitary thermoelectric system of the first set comprises an electric changeover switch connected in parallel to the terminals of the unitary thermoelectric system, said changeover switch comprising a resistor having a lower series resistance than a series resistance of the associated unitary thermoelectric system.

8. The device according to claim 1, wherein the second set of unitary thermoelectric systems is connected so that the electric circuit comprises a plurality of series of unitary thermoelectric systems, all the series comprising an identical number of unitary thermoelectric systems and being connected in parallel to one another.

9. An operating method of a thermoelectric device comprising:
    a first set of unitary thermoelectric systems comprising at least one faulty unitary thermoelectric system and functional unitary thermoelectric systems,
    detecting the functional unitary thermoelectric systems in the first set of unitary thermoelectric systems,
    electrically connecting a second set of functional unitary thermo-electric systems, chosen from the first set of unitary thermoelectric systems, to form an electric circuit so that all the unitary thermoelectric systems of said electric circuit have an identical current flowing through them, and
    the thermoelectric device is configured to generate electric power by means of the identical unitary thermoelectric systems and by means of a temperature gradient available along the identical unitary thermoelectric systems.

10. The method according to claim 9, wherein prior to the electric connection step, an electric form of the circuit is determined according to measurement of a potential difference at the terminals of at least one unitary thermoelectric system of the second set or at the terminals of a functional thermoelectric system of the first set.

11. The method according to claim 9, wherein the electric circuit being designed to be connected to an energy conversion element comprising a required input power, the number of unitary thermoelectric systems of the second set depends on said required power.

12. The device according to claim 1 wherein each unitary thermoelectric system comprises at least one thermocouple.

13. The device according to claim 1 wherein the detector is configured to detect the faulty unitary thermoelectric systems in the first set of unitary thermoelectric systems and wherein the control circuit is configured so that the second set only includes functional thermoelectric systems.

14. The device according to claim 13 wherein the first set of unitary thermoelectric systems includes more functional unitary thermoelectric systems than the second set and wherein the control circuit is configured to replace a faulty unitary thermoelectric system of the second set of unitary thermoelectric systems by a functional unitary thermoelectric system when the detector detects said faulty unitary thermoelectric system in the second set.

15. The device according to claim 13 wherein the detector is configured to measure flow of a current between two terminals of a unitary thermoelectric system, to detect if said unitary thermoelectric system is a functional or a faulty unitary thermoelectric system according to said measure and to disconnect said faulty unitary thermoelectric system so that the second set only includes functional unitary thermoelectric systems.

16. The device according to claim 13 wherein each unitary thermoelectric system is associated to an electric changeover switch connected in parallel and having a series resistance lower than a series resistance of the unitary thermoelectric system.

17. The device according to claim 16 wherein the control circuit is configured to deactivate one of the unitary thermoelectric systems by shunting said one of the unitary thermoelectric systems by means of the associated electric changeover switch.

18. The device according to claim 1 wherein the second set comprises a plurality of identical unitary thermoelectric systems.

19. A thermoelectric device comprising:
a first set of identical unitary thermoelectric systems, each unitary thermoelectric system comprising at least one thermocouple, the first set being formed by a plurality of identical unitary thermoelectric systems, the first set comprising functional unitary thermoelectric systems and at least one faulty thermo-electric system,
a detector configured for detecting functional unitary thermoelectric systems of the first set of unitary thermoelectric systems,
a control circuit configured to electrically connect a second set of functional unitary thermoelectric systems chosen from said first set of unitary thermoelectric systems, in the form of an electric circuit wherein all the unitary thermoelectric systems of the electric circuit have the same current flowing through them, and
the thermoelectric device is configured to generate electric power by means of the identical unitary thermoelectric, systems and by means of a temperature gradient available along the identical unitary thermoelectric systems.

20. A thermoelectric device comprising:
a first set of identical unitary thermoelectric systems, each unitary thermoelectric system comprising at least one thermocouple, the first set comprising functional unitary thermoelectric systems and at least one faulty thermo-electric system,
a detector configured for detecting functional unitary thermoelectric systems of the first set of unitary thermoelectric systems, and
a control circuit configured to electrically connect a second set of functional unitary thermoelectric systems chosen from said first set of unitary thermoelectric systems, in the form of an electric circuit wherein all the unitary thermoelectric systems of the electric circuit have the same current flowing through them,
wherein the detector is configured to detect the faulty unitary thermoelectric systems in the first set of unitary thermoelectric systems and wherein the control circuit is configured so that the second set only includes functional thermoelectric systems, and
the first set of unitary thermoelectric systems includes more functional unitary thermoelectric systems than the second set and wherein the control circuit is configured to replace a faulty unitary thermoelectric system of the second set of unitary thermoelectric systems by a functional unitary thermoelectric system when the detector detects said faulty unitary thermoelectric system in the second set.

* * * * *

UNITED STATES PATENT AND TRADEMARK OFFICE
CERTIFICATE OF CORRECTION

| | |
|---|---|
| PATENT NO. | : 9,761,780 B2 |
| APPLICATION NO. | : 13/977282 |
| DATED | : September 12, 2017 |
| INVENTOR(S) | : Christelle Navone et al. |

Page 1 of 1

It is certified that error appears in the above-identified patent and that said Letters Patent is hereby corrected as shown below:

Item (73) should read:
Assignees: COMMISSARIAT À L'ENERGIE ATOMIQUE ET AUX ENERGIES ALTERNATIVES, Paris (FR); STMICROELECTRONICS INTERNATIONAL N.V., Amsterdam (NL)

Signed and Sealed this
Tenth Day of July, 2018

Andrei Iancu
*Director of the United States Patent and Trademark Office*